United States Patent [19]
Pontius

[11] Patent Number: 5,905,395
[45] Date of Patent: May 18, 1999

[54] MILLER EFFECT-BASED DELAY CIRCUIT

[75] Inventor: Dale E. Pontius, Colchester, Vt.

[73] Assignee: International Business Machines Corporation, Armonk, N.Y.

[21] Appl. No.: 08/837,858

[22] Filed: Apr. 22, 1997

[51] Int. Cl.$^6$ .................................................. H03K 5/14
[52] U.S. Cl. .......................... 327/262; 327/276; 327/284; 327/285; 327/288
[58] Field of Search .................................... 327/261, 262, 327/271, 272, 270, 276, 277, 278, 281, 284, 285, 288

[56] References Cited

U.S. PATENT DOCUMENTS

| | | | |
|---|---|---|---|
| 3,970,875 | 7/1976 | Leehan | 307/304 |
| 4,890,022 | 12/1989 | Endo | 307/602 |
| 5,229,667 | 7/1993 | Shimizu | 327/277 |
| 5,262,690 | 11/1993 | Cochran et al. | 307/601 |
| 5,352,945 | 10/1994 | Casper et al. | 327/261 |
| 5,440,260 | 8/1995 | Hayashi et al. | 327/278 |
| 5,764,093 | 6/1998 | Hayashi et al. | 327/276 |

Primary Examiner—Timothy P. Callahan
Assistant Examiner—Eunja Shin
Attorney, Agent, or Firm—Ratner & Prestia; Robert A. Walsh

[57] ABSTRACT

A delay circuit which employs a Miller effect to delay a signal while driving a subsequent amplifier stage. The Miller effect is dependent upon loading of the circuits on an integrated circuit upon which the delay circuit is implemented, which allows the delay circuit to compensate its delay in relation to other process variation delays present on the integrated circuit. The delay circuit has a first delay stage which delays an input signal and drives a second stage. The delay circuit incorporates a dummy drive stage which adds loading to the first delay stage. In addition, the dummy stage experiences dynamic loading of the delay chain between the first and second stages which allows the coupling of the effect of this dynamic loading back to the first stage through the Miller effect.

7 Claims, 5 Drawing Sheets

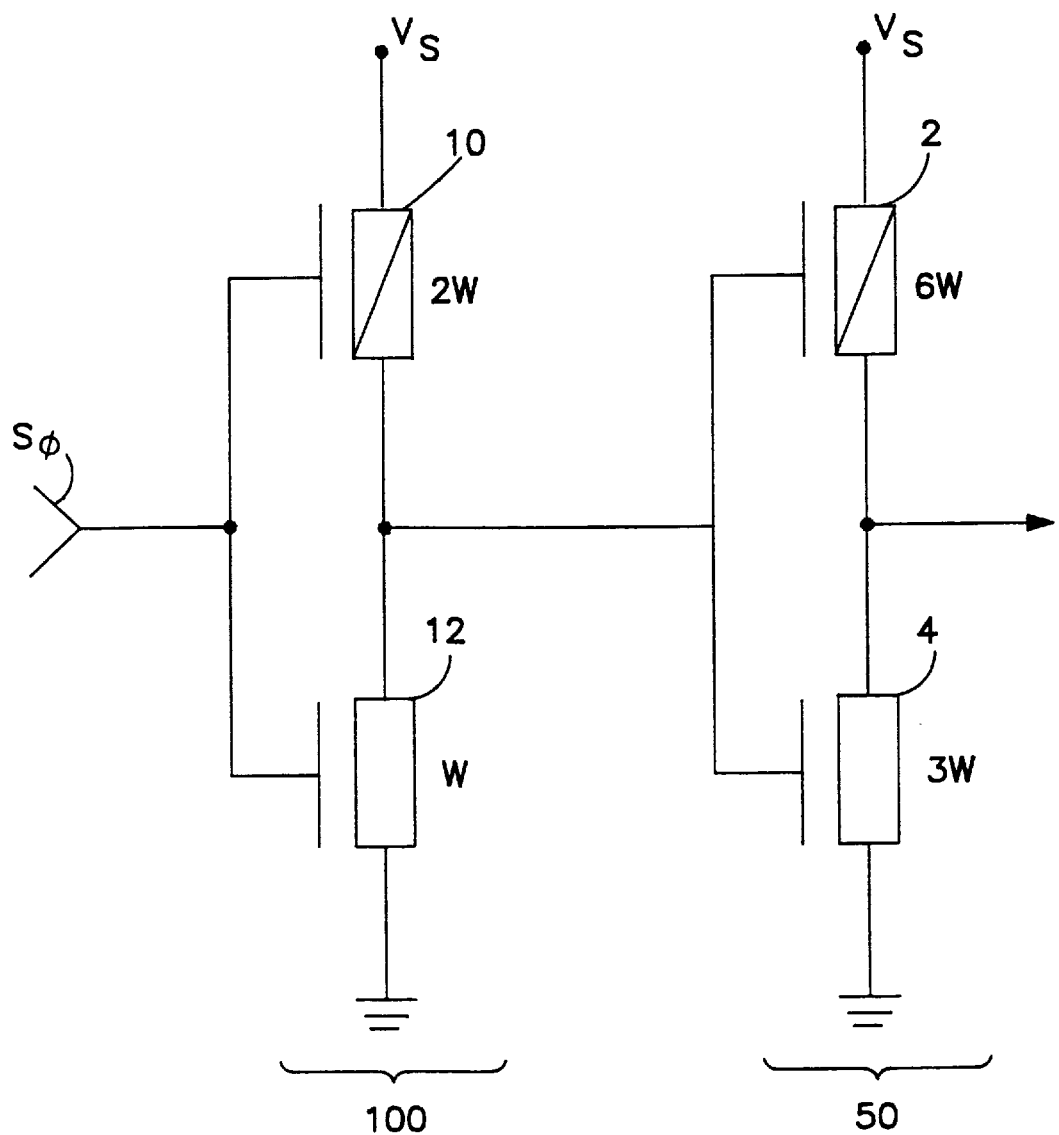
FIG. IB
PRIOR ART

MILLER EFFECT-BASED DELAY CIRCUIT

FIELD OF INVENTION

The present invention relates to a delay circuit and, more particularly, to a Miller effect-based delay circuit having a delay which tracking process-variation delays present on an integrated circuit.

BACKGROUND OF THE INVENTION

Generally, one use for delay circuits in integrated circuits (ICs) is to delay signal transmission to adjust for proper timing operation of circuit elements. In some delay circuits of the prior art, additional circuit elements are added, such as logic gates and inverters, to add delay from the additional propagation time of the signal through the added elements. However, some types of delay circuits utilize the Miller effect to provide a delay. For example, U.S. Pat. No. 4,890,022 entitled DELAY CIRCUIT DEVICE UTILIZING THE MILLER EFFECT to Endo, incorporated herein by reference, is directed to a delay line incorporating two transmission lines which are in close proximity to one another. Consequently, the two lines are capacitively coupled. When the same signal is applied to both lines, the Miller effect capacitive loading is either doubled if the two signals have opposite phase, or negligible if the signals have the same phase. Delay of a signal is determined by the phase of the signal on the second line.

More typically, the Miller Effect is used in delay circuits by providing a capacitive load to the transistor stages of a delay circuit. For example, U.S. Pat. No. 5,262,690 entitled VARIABLE DELAY CLOCK CIRCUIT to Cochran et al., incorporated herein by reference, is directed to a delay circuit for a clock signal in which a pair of differentially connected current switching transistors. Emitter follower drivers couple the switching transistors to a pair of differential delayed output terminals. A pair of diodes are cross-coupled across the differential output terminals which provide a load capacitance, which is magnified according to the gain of the transistor pair by the Miller effect. Changing the gain, therefore, changes the effective capacitance and hence, the delay, of the clock signal through the differential output terminals.

Similarly, as is known in the art, field effect transistors (FETs) have a load gate width which is seen as capacitive loading to functional circuits. Capacitive loading delays the signal passing through the delay circuit in a manner related to the time to charge the "capacitor" on the output of the functional circuit. For example, U.S. Pat. No. 5,440,260 entitled VARIABLE DELAY CIRCUIT to Hayashi et al., incorporated herein by reference, describes a functional circuit with a group of FETs arranged such that enabling the FET places the FET's capacitive load in parallel with other enabled FETs. By selectively enabling the FETs, a desired delay can be obtained.

Another reason for delay circuits on ICs is to compensate for variations in signal propagation caused by variations in parameters of the particular circuitry implemented on the IC. Such parameters may include process variations, such as circuit threshold, transconductance or topological variations, and environmental variations, such as power supply (voltage or current) and temperature variations. These variations require circuit designs with larger active devices. Driving stages experience larger loading with larger active devices which slows propagation of the signals through the devices. Consequently, load variations in different areas of circuitry on an IC may cause variations in signal propagation time through different parts of the IC.

Methods exist in the prior art to adjust circuit performance to compensate for variations in process parameters by using field effect transistors (FETs) following the functional circuits. In U.S. Pat. No. 3,970,875 entitled LSI CHIP COMPENSATOR FOR PROCESS PARAMETER VARIATIONS to Leehan, incorporated herein by reference, includes a compensating sense circuit formed as a field effect transistor circuit on an IC. The compensating circuit includes three FETs whose sensitivity is optimized such that changes in process parameters affect the output voltage. The sensing circuit compensates for load variations by adjusting the gate potential of FET load devices on the IC which are sensitive to process parameter changes.

SUMMARY OF THE INVENTION

The present invention relates to a circuit for delaying an electrical signal for use on an integrated circuit. The circuit includes a first inverter stage receiving the electrical signal at its input terminal, and its output terminal is connected to a common node. The first inverter stage has a first gate width. The circuit includes a second inverter stage having its input terminal connected to the common node and the delayed electrical signal is provided at its output terminal. The second inverter stage has a second gate width which is substantially equivalent to the first gate width. The circuit also includes a dummy inverter stage having its input terminal connected to the common node and having a third gate width which is greater than each of the first gate width and the second gate width. The first inverter stage delays the electrical signal when a load is applied to the common node, the load being associated with the third gate width and applied to the first inverter stage at the common node by the Miller Effect.

BRIEF DESCRIPTION OF THE DRAWING

These and other features and advantages of the present invention will become apparent from the following detailed description, taken in conjunction with the accompanying drawings, wherein:

FIG. 1B illustrates an exemplary embodiment of a circuit commonly employing a buffer stage as used in the prior art.

DETAILED DESCRIPTION

Overview

Figure 1A:
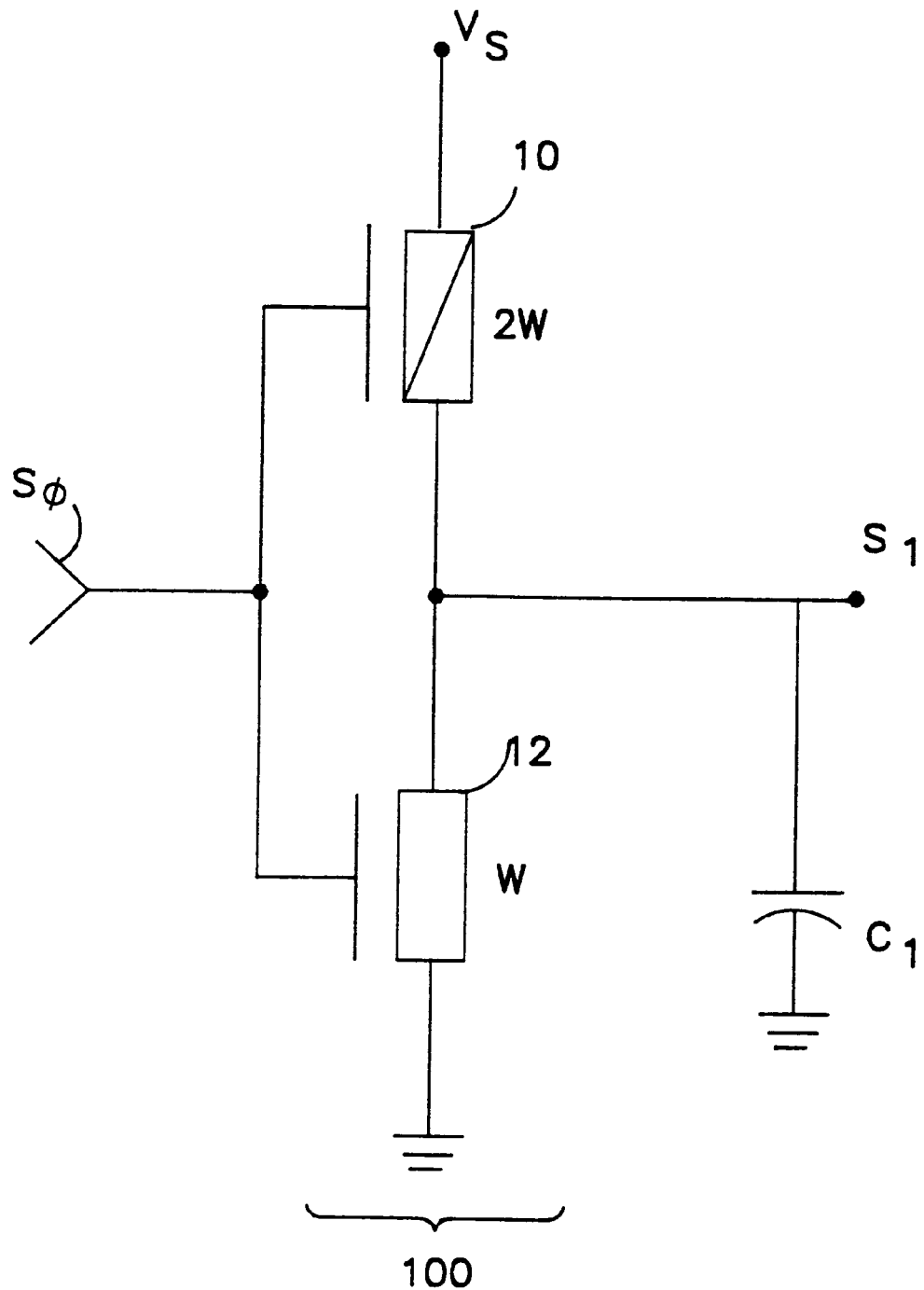
FIG. 1A illustrates an exemplary embodiment of a delay circuit with a capacitive load commonly used in the prior art.

Since the design objective of delay chains is meant to slow the propagation time of a signal but not buffer the drive of a signal for driving subsequent elements, the prior art commonly employs long-channel FETs or capacitive loading to slow the signal down. FIG. 1A illustrates an exemplary embodiment of a delay circuit with a capacitive load commonly used in the prior art. As shown, 55 delay stage 100 drives a load capacitor $C_1$. However, the delay provided by a particular long-channel FET or capacitive load does not necessarily track the delay of other circuits implemented on the same IC when process or environmental changes are present.

FIG. 1B illustrates an exemplary embodiment of an inverter driving a buffer stage, which exhibits a signal delay, as commonly used in IC circuit layouts of the prior art (commonly called fan out stages). As shown in FIG. 1, a second inverter stage 50 is driven by a first inverter stage 100. First inverter stage 100 consists of a p-type field effect transistor (PFET) 10 and n-type field effect transistor (NFET) 12 which are connected in series so that the drain of PFET 10 is connected to source of PFET 12, and a voltage $V_s$ is applied across the series connected PFET 10 and NFET 12. A input signal is applied at node $S_0$ which applies a potential across the gate of PFET 10 and NFET 12. As shown in FIG. 1, the gate of NFET 12 has a gate width of w, also called a load gate width which is related to the gate capacitance from a gate to drain overlap for the device. Similarly, PFET 10 has a load gate width of 2 w.

As is known in the prior art, a given buffer or logic stage, such as the second inverter stage 50, loads the first inverter stage 100, with three times the gate width of the driving stage (an industry standard, but can be varied). In the buffer stage, the power consumption used by the second stage 50 is higher than of the first inverter stage 100 because the second stage drives other subsequent stages. The second inverter stage includes PFET 2 with gate width 6 w in series with NFET 4 having gate width 3 w. Consequently, the total gate capacitance of the second inverter stage 50 appears as a load capacitance to the first inverter stage 100. In addition, the apparent load capacitance is increased by the Miller Effect, which is related to the gain of the PFET 2 and NFET 4 devices.

The method of the present invention employs dynamic loading of inverter stages to compensate for changes in loading by process or environmental changes. Dynamic loading of inverter stages means that each stage of a delay chain is fully loaded in the same manner as any other circuit implemented on an IC. The load is dynamic because the loading increases or decreases as opposed to a simple static capacitance as implemented in the prior art. The exemplary embodiments of the present invention employ a "dummy" circuit which reacts to these changes in loading. The changes in load experienced by the dummy circuit couples back into the delay stage through the Miller Effect, but because the dummy stage is not used to drive subsequent stage, power consumption by the added inverter is negligible. For high voltages or fast swings the coupling effect is more pronounced. Dynamic loading on delay stages of the present invention allows for all circuits implemented on the IC to respond similarly to process, voltage, and temperature variation in a similar fashion to the other circuitry on the IC.

The Miller Effect-based Delay Circuit of the Present Invention

Figure 2:
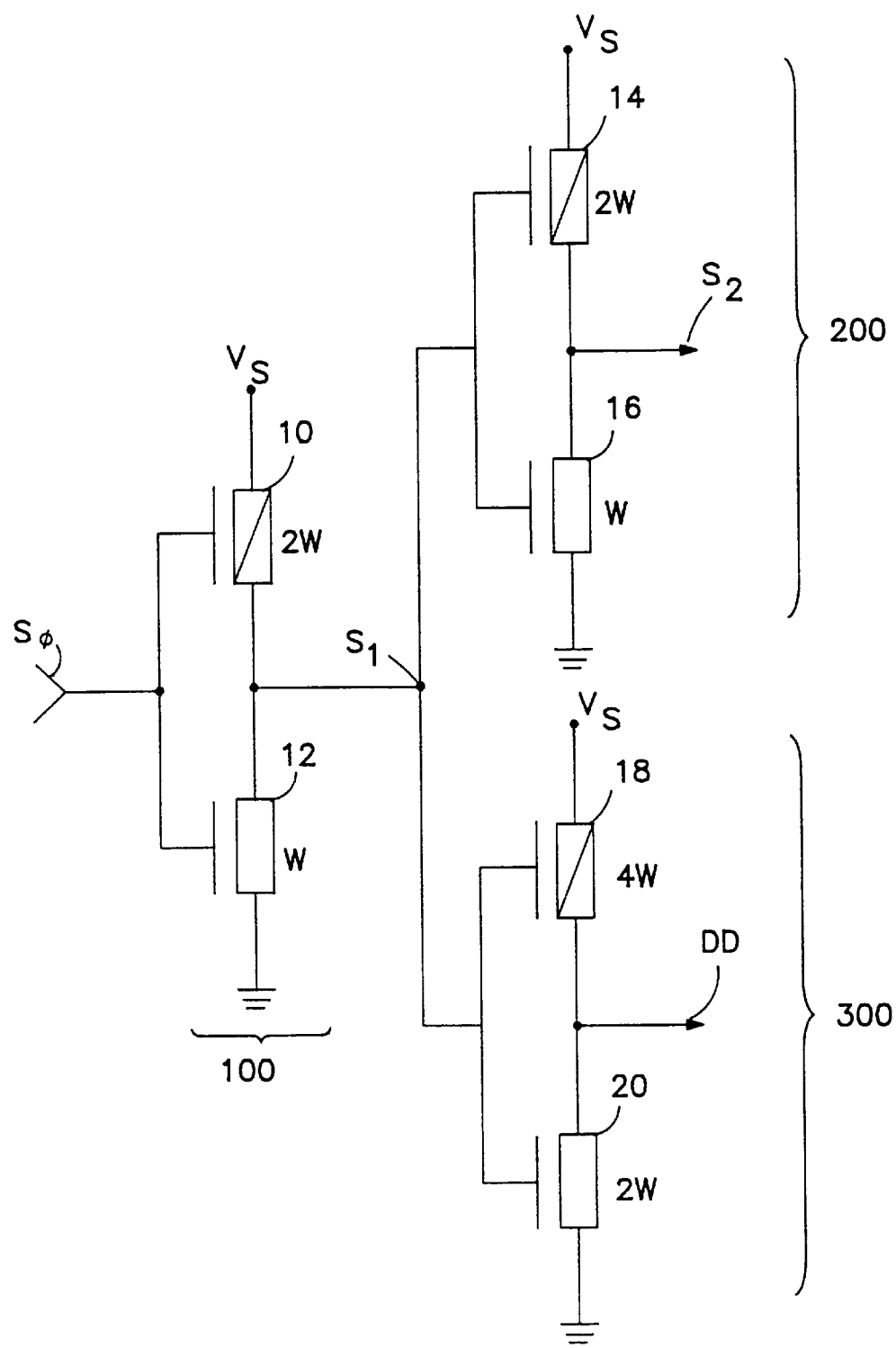
FIG. 2 illustrates a first exemplary embodiment of the Miller effect-based delay circuit of the present invention.

FIG. 2 illustrates a first exemplary embodiment of the Miller effect-based delay circuit of the present invention. The exemplary embodiments of the present invention are configured to dynamically load inverter stages and may be implemented as circuits on the IC.

The delay circuit of an exemplary embodiment of the present invention as shown in FIG. 2 includes an inverter 100 (first stage) with a given pullup P-Field Effect Transistor (PFET) 10 with load gate width 2 w, and a respective pulldown N-Field Effect Transistor (NFET) 12 with a load gate width w (about half the size of the PFET 10 load gate width). Consequently, the first stage has a load gate width of 3 w.

As described previously, the prior art circuits which may buffer the signal would drive a following stage with a PFET and NFET stage totaling about three times the total gate width size of the first stage 100. However, the present invention includes a second inverter 200 (second stage), having PFET 14 with gate width 2 w and NFET 16 with gate width w connected in series and output Node S2, which has substantially the same total load gate width, 3 w, as the first stage 100 so as to not buffer the signal.

Further, a dummy stage 300 with output Node DD is added to the side of the second stage 200 at Node S1. The dummy stage 300 includes PFET 18 having load gate width 4 w and NFET 20 having load gate width 2 w which are connected in series across the supply voltage $V_s$. As shown in FIG. 2, the load gate width of the dummy stage 300 of one embodiment of the present invention has a load gate width of 6 w, which may be approximately twice the size of the load gate width, 3w, of the second stage 200. The term "added by the side" indicates that the dummy stage 300 is physically positioned next to the second stage 200, and the stages are effectively seen as a parallel load to the first stage 100. Also, the output signals of Node S1 and Node DD are approximately the same value.

The dummy stage 300 is added load to the first delay stage 100, and in addition has a dynamic component at the output signal Node DD that couples back to its input Node at S1 through the Miller Effect, as is well known by one skilled in the art. The load gate widths of inverter stage 200 and dummy stage 300 provide an essentially capacitive loading to the first inverter stage 100. The coupling of the load of the inverter gates at Node DD, and to some extent the load of the inverter gates at Node S2, to the input node $S_1$ becomes a load driven by the first inverter stage 100, and approximates the same dynamic coupling encountered when the first stage 100 drives a load such as a buffer or similar logic circuit (described with respect to FIG. 1). This loading of the first stage slows the propagation of the signal through the delay stage of the exemplary embodiment about the same amount as if the first stage 100 were to drive a buffer circuit as in the prior art.

Figure 3:
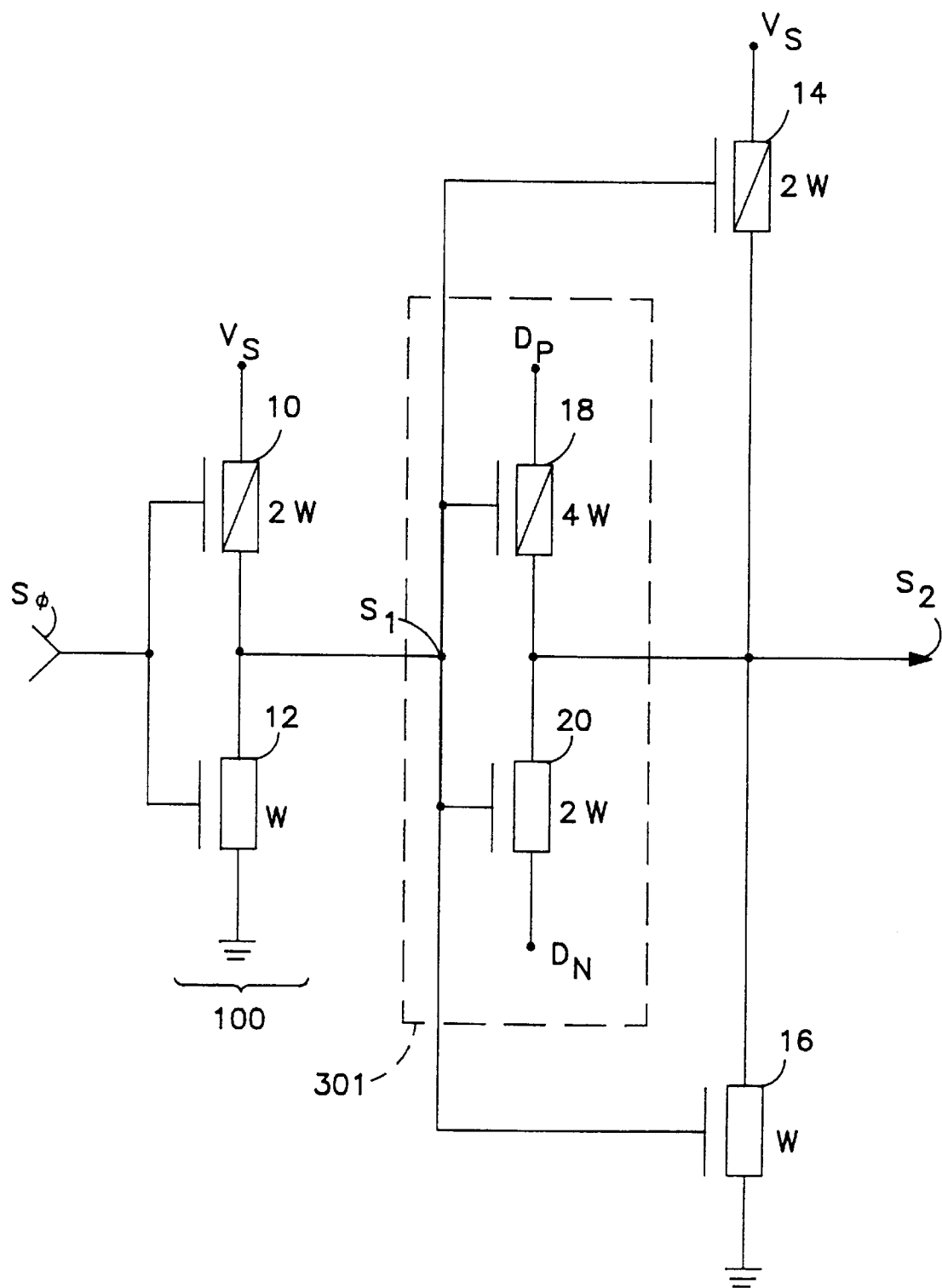
FIG. 3 illustrates a second exemplary embodiment of the Miller effect-based delay circuit of the present invention which minimizes power consumption as compared to the circuit of FIG. 2.

FIG. 3 illustrates a second exemplary embodiment of the Miller effect-based delay circuit of the present invention which is less sensitive to power supply variations than the circuit of FIG. 2. As subsequently described, the second embodiment of the present invention may be derived from the first embodiment. The exemplary delay circuit of FIG. 3 includes the first stage 100 and second stage 200 as shown in FIG. 2. However, a slightly different dummy stage 301 is added, which has the same 30 combination of PFET 18 and NFET 20 width load gate width 6w as described in FIG. 2.

Dummy stage 301 includes PFET 18 and NFET 20 connected in series, but in this embodiment the source of the PFET 18 and the drain of NFET 20 are left "dangling" by removing the voltage $V_s$. As before, the input gates of PFET 18 and NFET 20 are connected to Node $S_1$, and the output of the dummy stage (the node at which the drain of PFET 18 and source of NFET 20 are connected) is connected to the output node $S_2$.

In the first exemplary embodiment of FIG. 2, the dummy stage 300 drives Node DD because of the voltage Vs across the dummy stage; consequently, the dummy stage 300 may consume some power to drive this output Node DD. It is desirable to keep the power consumption for the delay circuit as low as possible. Note that node DD at the output of the dummy stage is essentially the same as the output of the next delay stage, node $S_2$.

Referring to FIG. 3, the PFET 18 and NFET 20 of the dummy stage are disconnected so as not to be driven by the voltage Vs, the input node is still connected at Node $S_1$, and the output Node DD is attached to the output Node S2 of the second stage 200. The former power supply nodes are not terminated, so that only the edge (the gate to drain overlap region) of the gate region of each device provides a load coupling back to node $S_1$. The dangling edge of the gate region contributes some coupling, but not so much as to invalidate circuit operation, as because the nodes $D_P$ and $D_N$ are driven for half the input signal period as in a source-follower configuration. In fact, any additional coupling it generates generally stabilizes the circuit a bit better with respect to power supply variations. This exemplary embodiment has only a minor loss in delay tracking accuracy due to the floating termination of the $D_P$ and $D_N$ Nodes.

Figure 4:
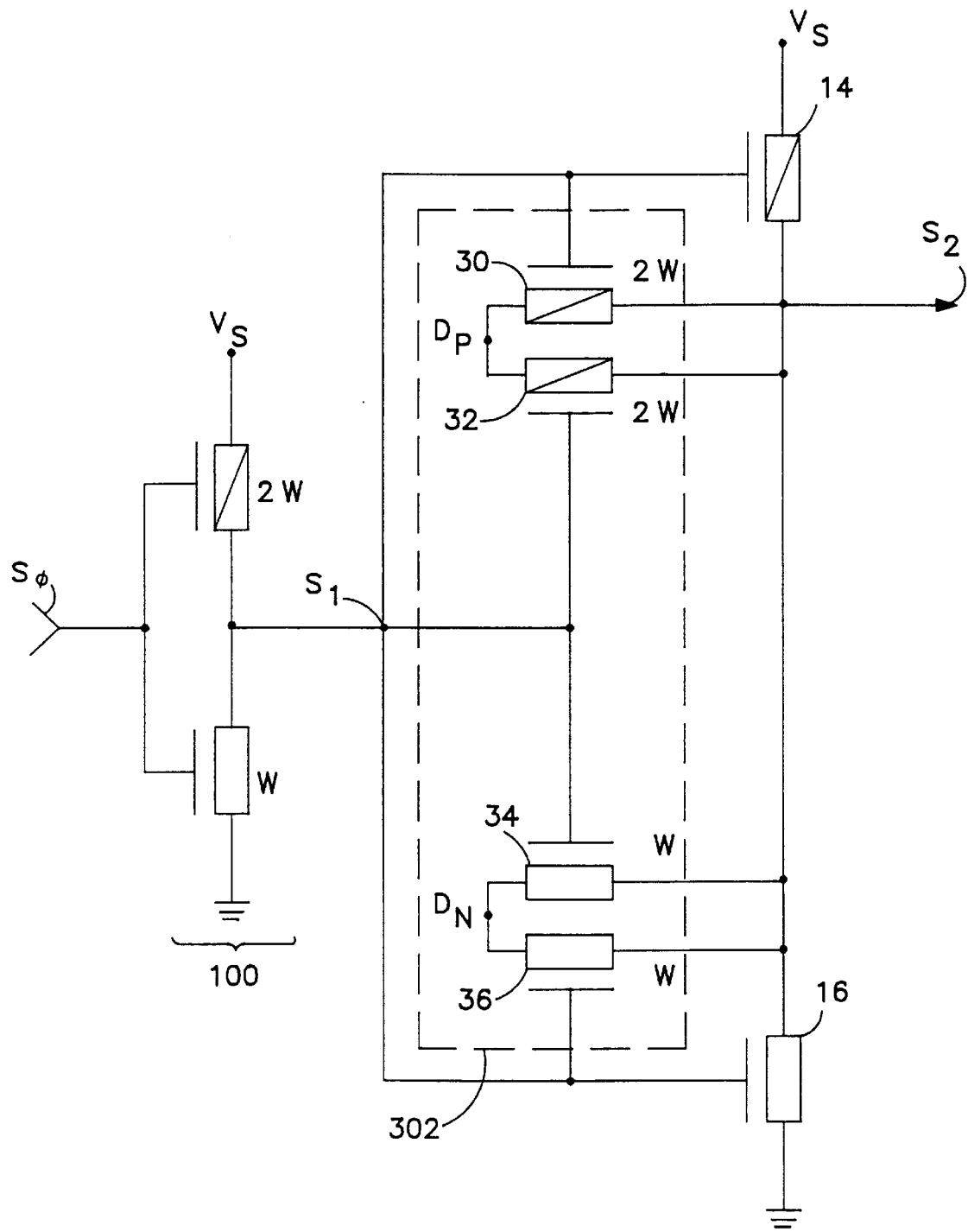
FIG. 4 illustrates a third exemplary embodiment of the Miller effect-based delay circuit of the present invention incorporating a variation of the circuit layout shown in FIG. 3.

FIG. 4 illustrates a third exemplary embodiment of the Miller effect-based delay circuit of the present invention incorporating a variation of the circuit layout shown in FIG. 3, but the embodiment of FIG. 4 may have advantages such as, for example, a more convenient circuit layout for automated circuit test checking methodologies.

In the third exemplary embodiment, the dummy stage 302 is formed from two PFETs 30 and 32 each having a load gate width of 2 w, and two NFETs 34 and 36 each having a load gate width w. PFETs 30 and 32 and NFETs 34 and 36 correspond to the PFET 18 and NFET 20 from the dummy stage 301 of FIG. 2 which are each divided in half and connected in series. Each device connects back to the output Node S2, and the dangling Nodes $D_P$ and $D_N$ are now at the junction of the split devices. Consequently, the loading effect of the gates of the devices add (the gate capacitances are in parallel) and the net effect is still a loading gate width of 6 w. The circuit shown in FIG. 3 may be implemented, for example, on a 16 Megabyte synchronous dynamic random access memory (SDRAM) chip.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed:

1. A delay circuit for an electrical signal for use on an integrated circuit comprising:

a first stage including a first p-channel transistor having its source connected to a supply voltage terminal, its drain connected to a first node and its gate connected to an input terminal, and a first n-channel transistor having its source connected to the first node, its drain connected to a ground terminal and its gate connected to the input terminal, wherein the first p-channel transistor and the first n-channel transistor each has a respective gate width;

a second stage including a second p-channel transistor having its source connected to the supply voltage terminal, its drain connected to an output terminal and its gate connected to the first node, and a second n-channel transistor having its source connected to the output terminal, its drain connected to the ground terminal and its gate connected to the first node, wherein the second p-channel transistor and the second n-channel transistor each has a respective gate width which is substantially equivalent to the respective gate width of the first p-channel transistor and the first n-channel transistor, and each respective gate width being combined to form a first gate area having a first load value; and a dummy stage including a third p-channel transistor having its source not terminated, its drain connected to the output terminal and its gate connected to the first node, and a third n-channel transistor having its source connected to the output terminal, its drain not terminated and its gate connected to the first, node, the third p-channel transistor and the third n-channel transistor each having a respective gate width which is a multiple of the respective gate width of the first p-channel transistor and the first n-channel transistor, and each respective gate width being combined to form a second gate area having a second load value, wherein the dummy stage is located in a close proximity to the second stage, and a load of the first stage at the first node is related to the first load value and the second load value coupled to the first node by the Miller-effect.

2. The delay circuit for the electrical signal as recited in claim 1, wherein the close proximity is defined as the third p-channel transistor being adjacent to the second p-channel transistor and the third n-channel transistor being adjacent to the second n-channel transistor, and the dummy stage positioned between the second p-channel transistor and the second n-channel transistor.

3. The delay circuit for the electrical signal as recited in claim 1, wherein:

the third p-channel transistor is formed from a first pair of p-channel transistors connected in series at one respective source and drain of the first pair, the other respective source and drain of the first pair connected to the output terminal, with the not terminated source being at the junction of the first pair; and the third n-channel transistor is formed from a second pair of n-channel transistors connected in series at one respective source and drain of the second pair, the other respective source and drain of the second pair connected to the output terminal, and with the not terminated drain being at the junction of the second pair.

4. The delay circuit for the electrical signal as recited in claim 1, wherein the multiple value is related to a total delay period for the electrical signal to propagate from the input terminal to the output terminal.

5. The delay circuit for the electrical signal as recited in claim 1, wherein a total gate area being the combination of the first gate area and the second gate area is greater than a sum of each respective gate width of the first stage.

6. The delay circuit for the electrical signal as recited in claim 5, wherein the total gate area is at least three times the sum of each respective gate width of the first stage.

7. A circuit for delaying an electrical signal for use on an integrated circuit comprising:

a first inverter stage receiving the electrical signal at its input terminal and its output terminal connected to a common node, the first inverter stage having a first gate width and a Miller effect;

a second inverter stage having its input terminal connected to the common node, the second inverter stage having an output terminal, a second gate width substantially similar to the first gate width, and a Miller effect;

a dummy inverter stage having its input terminal connected to the common node, its output terminal connected to the output terminal of the second inverter stage, and a third gate width which is greater than each of the first and second gate widths, and providing a Miller effect operating in a manner similar to the Miller effect of the first inverter and second inverter stages; and a source-to-drain potential connected across the first inverter stage and the second inverter stage but not across the dummy inverter stage.

* * * * *